United States Patent
Shin et al.

(10) Patent No.: US 8,483,002 B2
(45) Date of Patent: Jul. 9, 2013

(54) ANTIFUSE UNIT CELL OF NONVOLATILE MEMORY DEVICE FOR ENHANCING DATA SENSE MARGIN AND NONVOLATILE MEMORY DEVICE WITH THE SAME

(75) Inventors: Chang-Hee Shin, Chungcheongbuk-do (KR); Ki-Seok Cho, Chungcheongbuk-do (KR); Seong-Do Jeon, Chungcheongbuk-do (KR); Youn-Jang Kim, Chungcheongbuk-do (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 571 days.

(21) Appl. No.: 12/609,369

(22) Filed: Oct. 30, 2009

(65) Prior Publication Data

US 2010/0309709 A1 Dec. 9, 2010

(30) Foreign Application Priority Data

Jun. 5, 2009 (KR) .................. 10-2009-0049834

(51) Int. Cl.
*G11C 17/16* (2006.01)
(52) U.S. Cl.
USPC .......... 365/225.7; 365/96; 365/102; 365/104; 365/205; 365/207; 365/200
(58) Field of Classification Search
USPC ............. 365/96, 94, 102, 104, 103, 225.7, 365/205, 207, 200
See application file for complete search history.

(56) References Cited

U.S. PATENT DOCUMENTS

| | | | |
|---|---|---|---|
| 5,748,025 A | 5/1998 | Ng et al. | 327/333 |
| 6,306,689 B1 | 10/2001 | Kim et al. | 438/131 |
| 6,927,997 B2 | 8/2005 | Lee et al. | |
| 7,102,951 B2 * | 9/2006 | Paillet et al. | 365/225.7 |
| 7,349,281 B2 | 3/2008 | Kouchi et al. | |
| 7,852,656 B2 * | 12/2010 | Shin et al. | 365/94 |
| 2006/0092742 A1 | 5/2006 | Paillet et al. | |
| 2008/0198643 A1 | 8/2008 | Shin et al. | |
| 2009/0262567 A1 * | 10/2009 | Shin et al. | 365/96 |

FOREIGN PATENT DOCUMENTS

| | | |
|---|---|---|
| CN | 1129913 C | 12/2003 |
| CN | 101253573 A | 8/2008 |
| CN | 101425341 A | 5/2009 |
| KR | 10-0845407 B1 | 7/2008 |
| KR | 10-2009-0087659 | 8/2009 |
| WO | WO 2007/027607 | 3/2007 |

OTHER PUBLICATIONS

Korean Office Action issued on Nov. 12, 2010, in corresponding Korean Patent Application No. 10-2009-0049834 (4 pages).
Norm Robson et al., "Electrically Programmable Fuse (eFUSE): From Memory Redundancy to Autonomic Chips," IEEE 2007 Custom Intergrated Circuits Conference (CICC), 2007, pp. 799-804.
Chinese Office Action issued Jul. 18, 2012, in counterpart Chinese Application No. 201010002347.1.

* cited by examiner

*Primary Examiner* — Andrew Q Tran
(74) *Attorney, Agent, or Firm* — NSIP Law

(57) ABSTRACT

Disclosed are a unit cell capable of improving a reliability by enhancing a data sensing margin in a read operation, and a nonvolatile memory device with the same. The unit cell of a nonvolatile memory device includes: an antifuse having a first terminal between an input terminal and an output terminal; and a first switching unit coupled between a second terminal of the antifuse and a ground voltage terminal.

25 Claims, 12 Drawing Sheets

FIG. 3
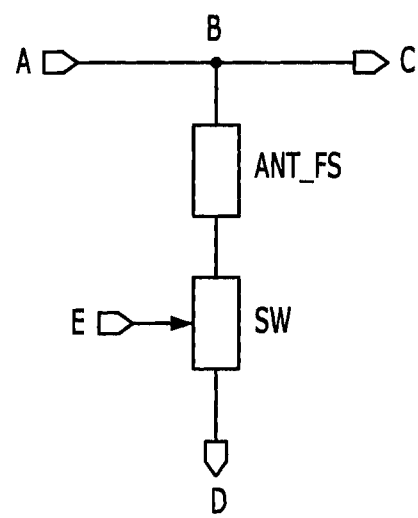
FIG. 4A        FIG. 4B
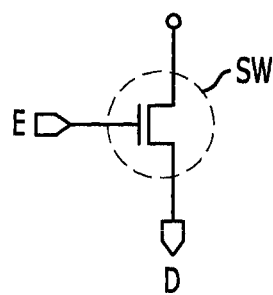   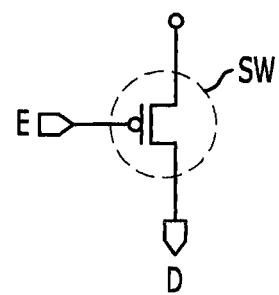

FIG. 5A    FIG. 5B
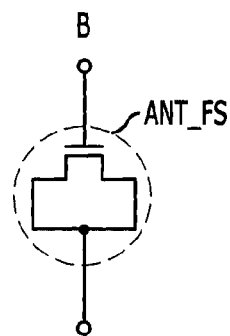
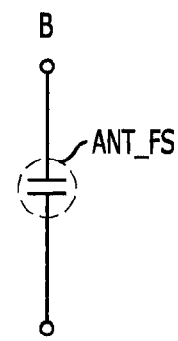
FIG. 6
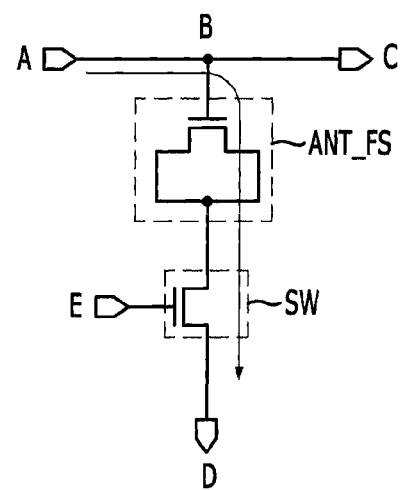

FIG. 7A
FIG. 7B
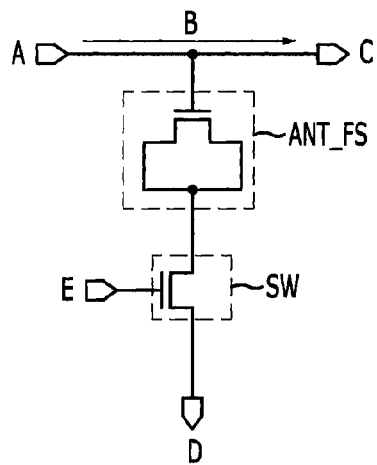
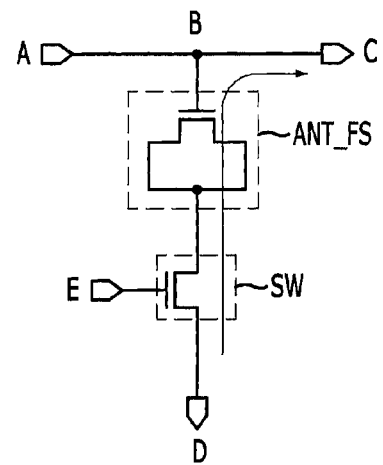
FIG. 8
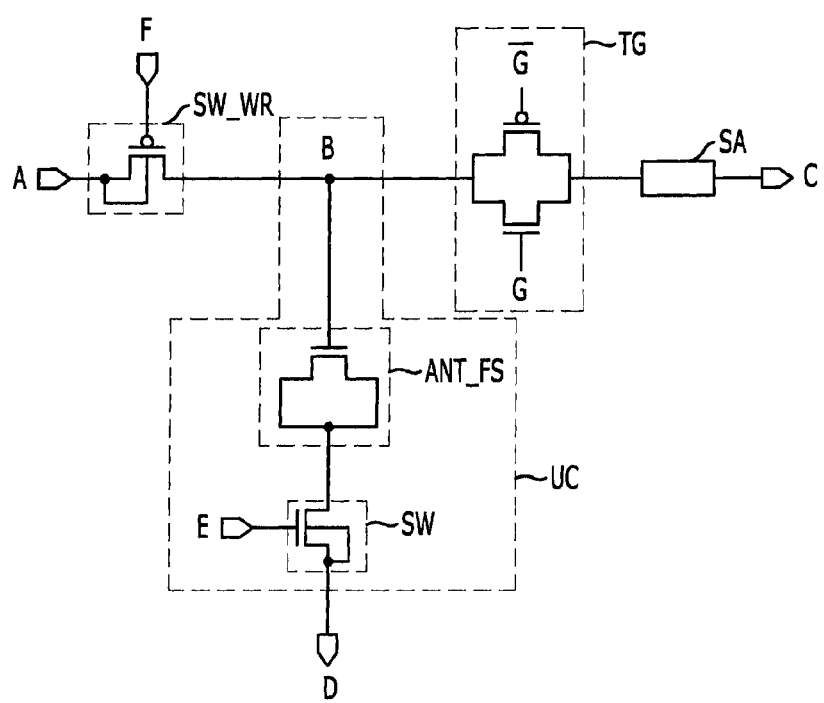

ANTIFUSE UNIT CELL OF NONVOLATILE MEMORY DEVICE FOR ENHANCING DATA SENSE MARGIN AND NONVOLATILE MEMORY DEVICE WITH THE SAME

CROSS-REFERENCE TO RELATED APPLICATIONS

The present invention claims priority of Korean Patent Application No. 10-2009-0049834, filed on Jun. 5, 2009, which is incorporated herein by reference in its entirety.

BACKGROUND OF THE INVENTION

1. Field of the Invention

The present invention relates to a semiconductor design technology; and, more particularly, to a one-time programmable (OTP) unit cell using a CMOS gate-oxide antifuse and a nonvolatile memory device with the same.

2. Description of Related Art

One-time programmable (OTP) unit cells using an antifuse formed by a gate oxide layer of a complementary metal-oxide-semiconductor (CMOS) (Hereinafter, referring to as "a CMOS gate-oxide antifuse") are formed inside a volatile memory device such as Dynamic Random-Access-Memory (DRAM) or a nonvolatile memory device, such as an Electrically Erasable Programmable Read-Only-Memory (EEPROM) or a flash memory, and are used for memory repair purpose. In addition, the OTP unit cells are used for internal operating voltage and frequency trimming in a mixed-signal chip where an analog chip and a digital chip are mixed.

Generally, each OTP unit cell includes a CMOS gate-oxide antifuse and one or more MOS transistors. Such an OTP unit cell is formed inside each memory chip in a single or array configuration and is used for repair or trimming.

FIG. 1 is an equivalent circuit diagram of a typical OTP unit cell.

Referring to FIG. 1, the typical OTP unit cell includes an antifuse ANT_FS1 and transistors NM1 and NM2. The antifuse ANT_FS1 is connected between an input node A and a node B. The transistors NM1 and NM2 are n-channel transistors, and are connected in series between the node B and an output node E which is a terminal through which data are outputted during a read operation.

The typical OTP unit cell has to include the transistors NM1 and NM2 connected in series for forming a current path from the input node A to the output node E during the read operation. Accordingly, a final data is outputted from the output node E with a state that its voltage is dropped by a total amount of threshold voltages of the transistors NM1 and NM2, i.e., VDD−2*Vt, 'Vt' denoting the threshold voltage of each transistor NM1 and NM2. As a result, since a sensing margin of data outputted from the output node E becomes narrower, a malfunction occurs during the read operation, which degrades the reliability in the read operation of the OTP unit cell.

In FIG. 1, each of reference symbols 'C' and 'D' denotes an input node receiving control signals.

To improve performance of the typical OTP unit cell shown in FIG. 1, an OTP unit cell having a new structure is disclosed in a commonly owned copending application, KR Registration No. 10-0845407 issued on Jul. 3, 2008, and filed on Feb. 16, 2007, entitled "ONE-TIME-PROGRAMMABLE CELL AND MEMORY DEVICE HAVING THE SAME".

FIG. 2 is an equivalent circuit diagram of an OTP unit cell proposed in a Korean Patent application, KR Registration No. 10-0845407.

Referring to FIG. 2, the OTP unit cell includes an antifuse ANT_FS2, and first and second transistors PM1 and PM2 to output a voltage at a third node N3 as an output signal. The antifuse ANT_FS2 is coupled between the third node N3 and a ground voltage terminal. The first transistor PM1 has a gate receiving a write control signal WR_CTRL and a source-drain path between the third node N3 and a second node N2. The second transistor PM2 has a gate receiving a read control signal RD_CTRL and a source-drain path between a first node N1 and the third node N3. The OTP unit cell further includes a sensing amplifier 100 of an inverter type for sensing and amplifying the output signal.

In the OTP unit cell shown in FIG. 2, a write voltage and a read voltage are applied to the antifuse ANT_FS2 through different paths from each other since the antifuse ANT_FS2 and the first and second transistors PM1 and PM2 are coupled in parallel. Accordingly, loss of the read voltage during a read operation can be minimized in comparison with the OTP unit cell shown in FIG. 1, and thus, a sensing margin of data outputted from the OTP unit cell becomes broader to thereby improve the reliability in the read operation of the OTP unit cell.

As described above, the OTP unit cell shown in FIG. 2 can improve the reliability in the read operation in comparison with the OTP unit cell shown in FIG. 1. However, since the OTP unit cell shown in FIG. 2 includes one antifuse and two transistors like the OTP unit cell shown in FIG. 1, there is limitation to reduce a size and thus power consumption increases.

SUMMARY OF THE INVENTION

An embodiment of the present invention is directed to providing a unit cell capable of improving reliability by enhancing a data sensing margin in a read operation, and a nonvolatile memory device with the same.

Another embodiment of the present invention is directed to providing a unit cell capable of reducing its size and power consumption by simplifying its structure, and a nonvolatile memory device with the same.

In accordance with an aspect of the present invention, there is provided a unit cell of a nonvolatile memory device including: an antifuse having a first terminal between an input terminal and an output terminal; and a first switching unit coupled between a second terminal of the antifuse and a ground voltage terminal.

In accordance with another aspect of the present invention, there is provided a nonvolatile memory device including: a plurality of data lines; a plurality of unit cells coupled to the data lines in parallel; and a plurality of sensing amplifiers configured to sense and amplify data outputted from the data lines, wherein each unit cell includes: an antifuse having a first terminal coupled to a corresponding one of the data lines; and a first switching unit coupled between a second terminal of the antifuse and a ground voltage terminal.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

BRIEF DESCRIPTION OF THE DRAWINGS

FIG. 3 is an equivalent circuit diagram of a unit cell of a nonvolatile memory device in accordance with a first embodiment of the present invention.

FIGS. 4A and 4B are circuit diagrams of a first switching unit shown in FIG. 3.

FIGS. 5A and 5B are circuit diagrams of an antifuse shown in FIG. 3.

FIGS. 6 to 7B are equivalent circuit diagrams illustrating an operation of the unit cell of the nonvolatile memory device in accordance with the first embodiment of the present invention.

FIG. 8 is an equivalent circuit diagram of a unit cell of a nonvolatile memory device in accordance with a second embodiment of the present invention.

DESCRIPTION OF SPECIFIC EMBODIMENTS

Figure 1:
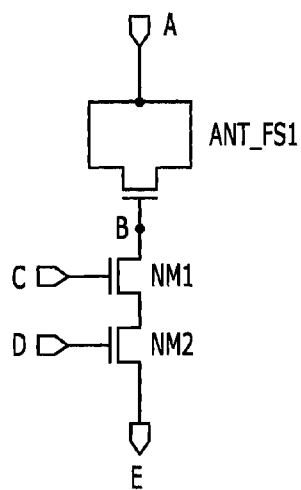
FIG. 1 is an equivalent circuit diagram of a typical OTP unit cell.
Figure 2:
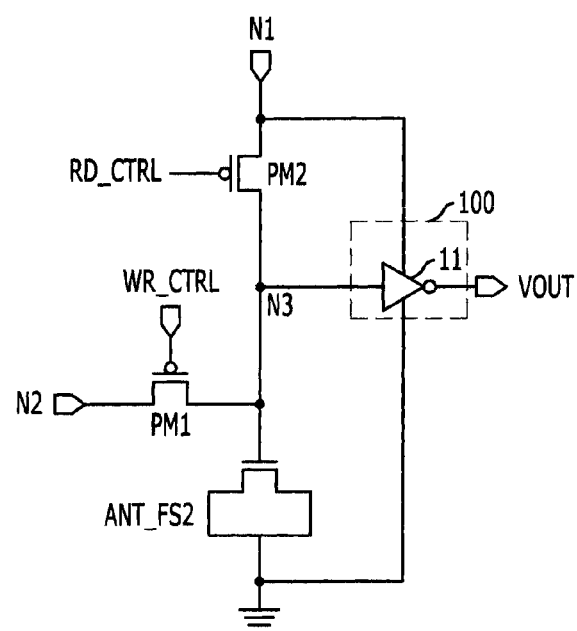
FIG. 2 is an equivalent circuit diagram of an OTP unit cell proposed in a Korean Patent application, KR Registration No. 10-0845407.

The advantages, features and aspects of the invention will become apparent from the following description of the embodiments with reference to the accompanying drawings, which is set forth hereinafter.

In the drawings, it will also be understood that la transistor' disclosed in the specification includes all elements operating as a switch unit in response to a control signal inputted to its gate, e,g., Junction FET (JFET) and MOS FET. Further, like reference numerals in the drawings denote like elements, and thus their description will be omitted First Embodiment FIG. 3 is an equivalent circuit diagram of a unit cell of a nonvolatile memory device in accordance with a first embodiment of the present invention.

Referring to FIG. 3, the unit cell of the nonvolatile memory device in accordance with the first embodiment includes an antifuse ANT_FS and a first switching unit SW. The antifuse ANT_FS has a first terminal coupled to a node B between an input terminal A and an output terminal C, and the first switching unit SW is coupled between a second terminal of the antifuse ANT_FS and a ground voltage terminal D.

The first switching unit SW is formed of a transistor of an active device to connect the second terminal of the antifuse ANT_FS with the ground voltage terminal D during a read operation or a write operation as shown in FIGS. 4A and 4B. Herein, the transistor is a low-voltage or a high-voltage transistor. Preferably, the first switching unit SW may be a low-voltage transistor to reduce power consumption. Furthermore, the transistor has a P-channel or an N-channel. Preferably, the first switching unit SW may be a transistor having an N-channel. At this time, the transistor has a drain coupled to the second terminal of the antifuse ANT_FS, a source coupled to the ground voltage terminal D, and a gate receiving a current control signal inputted through a current control signal input terminal E.

The antifuse ANT_FS is formed of a transistor of an active device or a capacitor of a passive device as shown in FIGS. 5A and 5B. The transistor has a P-channel or an N-channel. In case of the transistor, its gate is coupled to the node B, and both of its drain and source are coupled to the drain of the first switching unit SW. In case of the capacitor, a first terminal is coupled to the node B, and a second terminal is coupled to the drain of the first switching unit SW.

Hereinafter, the read operation and the write operation of the unit cell of the nonvolatile memory device in accordance with the first embodiment are explained in detail. It is assumed that both of the first switching unit SW and the antifuse ANT_FS are a transistor having an N-channel.

TABLE 1

| mode/terminal(node) | A | B | C | D | E |
|---|---|---|---|---|---|
| write operation | VPP | VPP | VPP | VSS | H |
| read operation | VDD | VDD or VSS | VDD or VSS | VSS | H |

Each operation is explained referring to Table 1, and FIGS. 6 to 7B. Herein, FIG. 6 is an equivalent circuit diagram illustrating a current path during the write operation, and FIGS. 7A and 7B are equivalent circuit diagrams illustrating a current path during the read operation.

Write Operation

Referring to FIG. 6, the ground voltage terminal D is grounded, a write voltage of a high voltage VPP is applied to the input terminal A, and a voltage of a logic high level corresponding to a supply voltage VDD is applied to the current control signal input terminal E. The high voltage VPP has a voltage level may break a gate insulation layer of the antifuse ANT_FS, which is higher than the supply voltage VDD. Under these conditions, the first switching unit SW is turned on. Accordingly, the high voltage VPP applied to the input terminal A is transferred to the antifuse ANT_FS through the node B to thereby break the gate insulation layer of the antifuse ANT_FS, which is formed between the gate of the antifuse ANT_FS and a substrate.

Read Operation

First, referring to FIG. 7B, after finishing the write operation, a read voltage of the supply voltage VDD is applied to the input terminal A, and a voltage of a logic high level corresponding to the supply voltage VDD is applied to the current control signal input terminal E. Under these conditions, the first switching unit SW is turned on. At this time, since the gate insulation layer of the antifuse ANT_FS is in a broken state, a current path of the node B->the antifuse ANT_FS->the first switching unit SW->the ground voltage terminal D is formed. As a result, the output terminal C is electrically coupled to the ground voltage terminal D through the antifuse ANT_FS and the first switching unit SW so that a data corresponding to a ground voltage ground voltage VSS is outputted to the output terminal C.

Next, referring to FIG. 7A, when the write operation is not performed and thus the gate insulation layer of the antifuse ANT_FS is not broken, the output terminal C is electrically isolated from the ground voltage terminal D through the antifuse ANT_FS and the first switching unit SW. As a result, the read voltage applied to the input terminal A is not discharged to the ground voltage terminal D through the antifuse ANT_FS but outputted to the output terminal C through the node B. That is, a data corresponding to the supply voltage VDD is outputted to the output terminal C.

Second Embodiment

FIG. 8 is an equivalent circuit diagram of a unit cell of a nonvolatile memory device in accordance with a second embodiment of the present invention.

Referring to FIG. 8, the unit cell of the nonvolatile memory device in accordance with the second embodiment includes an antifuse ANT_FS and a first switching unit SW such as the first embodiment. The unit cell further includes a second switching unit SW_WR coupled between an input terminal A and a node B, and a transmission gate TG coupled between the node B and an output terminal C. The unit cell further includes a sensing amplifier SA for sensing and amplifying an output signal outputted from the transmission gate TG.

The second switching unit SW_WR is formed of a transistor of an active device to transfer a read voltage and a write voltage applied through the input terminal A to a first terminal of the antifuse ANT_FS connected to the node B. Herein, the transistor has a P-channel or an N-channel. The second switching unit SW_WR may be a transistor including a P-channel having a drivability higher than an N-channel. At this time, the transistor has a drain coupled to the input terminal A, a source coupled to the node B, and a gate receiving a read/write control signal inputted through a read/write control signal input terminal F.

The transmission gate TG electrically disconnects the node B from the output terminal C during a write operation, and electrically connects the node B with the output terminal C during a read operation in response to a read control signal inputted through a read control signal input terminal G. The transmission gate TG includes two transistors, each transistor having a P-channel or an N-channel, and a drain coupled to a source.

Figure 15:
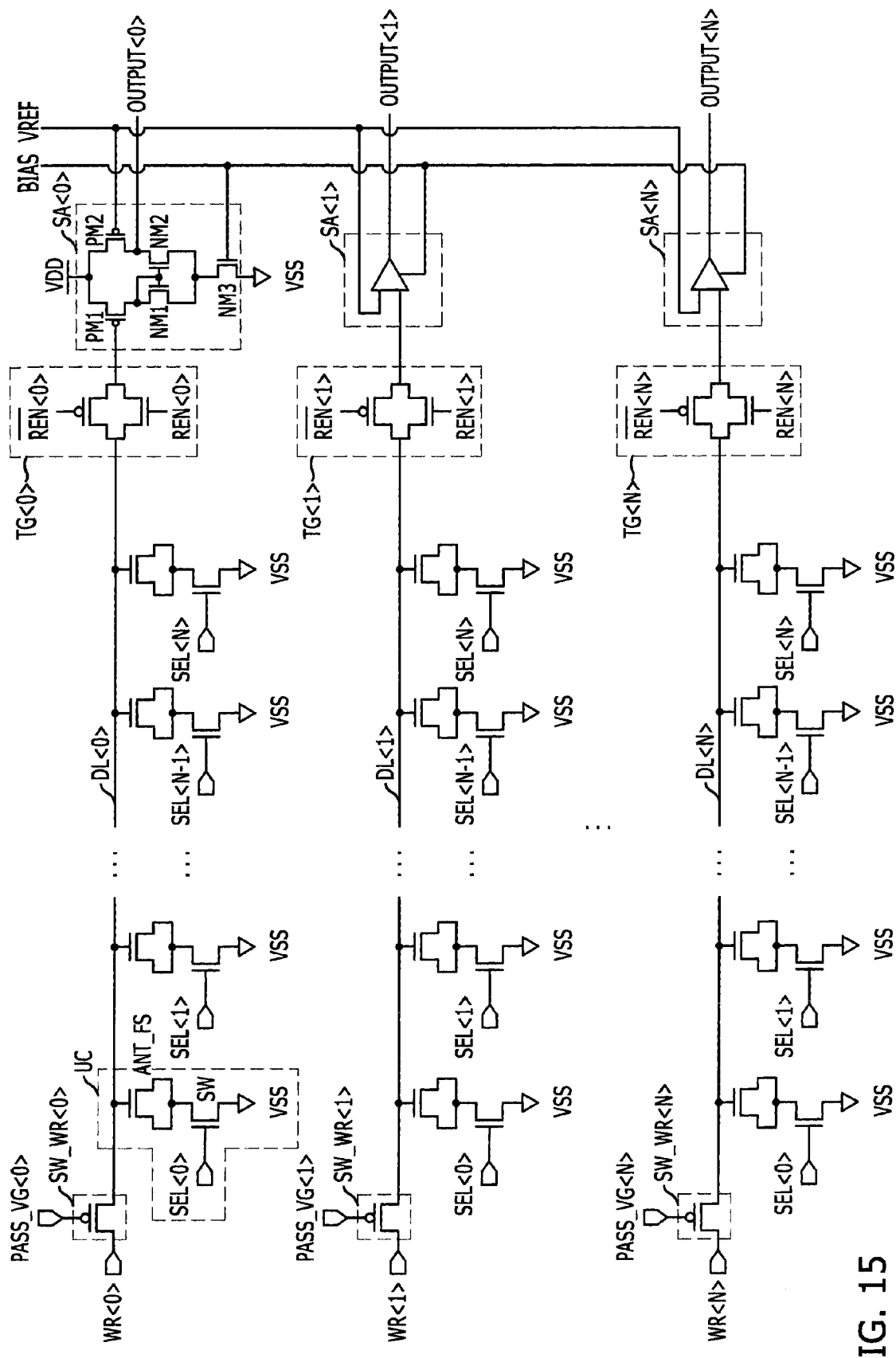
FIG. 15 is an equivalent circuit diagram of a nonvolatile memory device in accordance with a fifth embodiment of the present invention.
Figure 17:
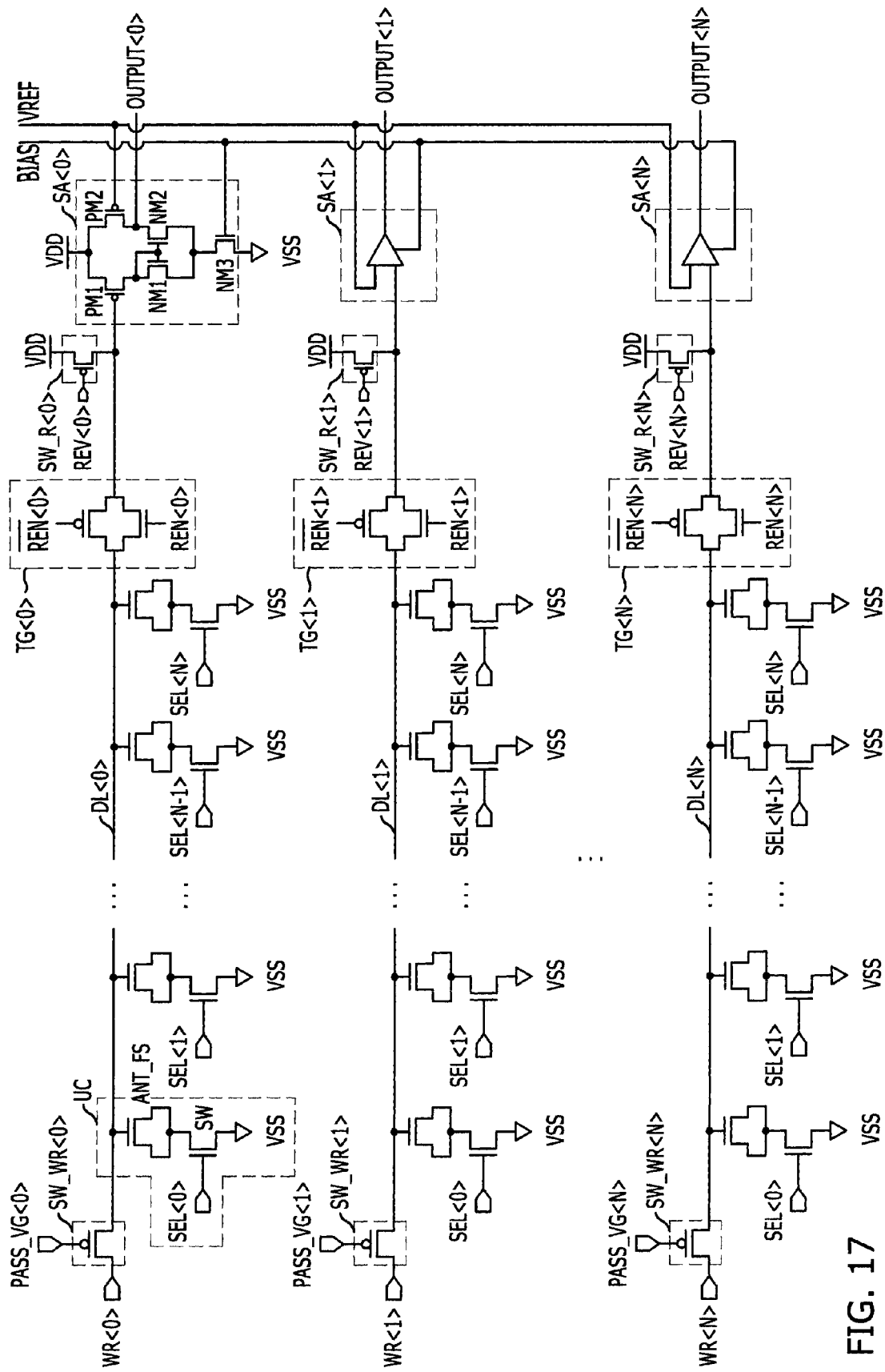
FIG. 17 is an equivalent circuit diagram of a nonvolatile memory device in accordance with a seventh embodiment of the present invention.

The sensing amplifier SA includes an inverter or a differential amplifier. The inverter is a CMOS transistor where transistors having a P-channel or an N-channel are complementarily coupled. An exemplary of the differential amplifier is shown in FIGS. 15 and 17.

Hereinafter, the read operation and the write operation of the unit cell of the nonvolatile memory device in accordance with the second embodiment are explained in detail. It is assumed that the first switching unit SW is a transistor having an N-channel, the second switching unit SW_WR is a transistor having a P-channel, and the antifuse ANT_FS is a transistor having an N-channel.

Figure 9:
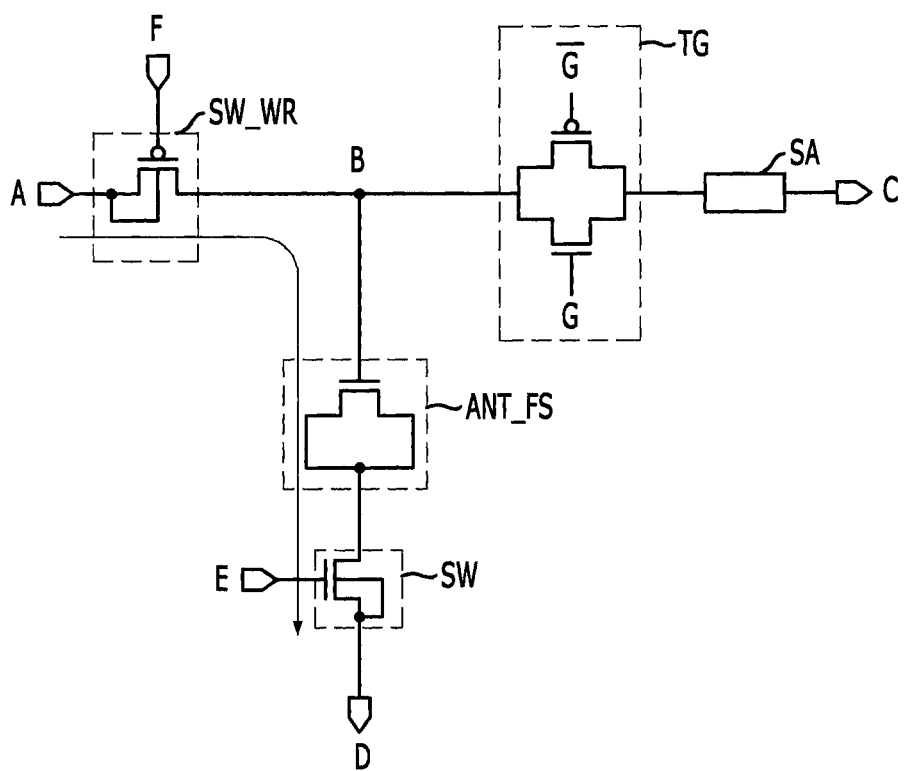
FIGS. 9 to 10B are equivalent circuit diagrams illustrating an operation of the unit cell of the nonvolatile memory device in accordance with the second embodiment of the present invention.
Figure 10A:
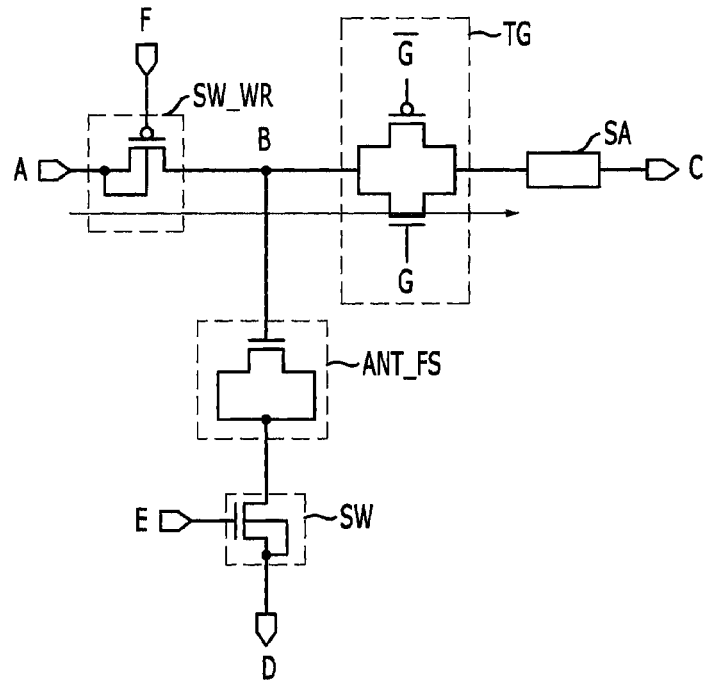
Figure 10B:
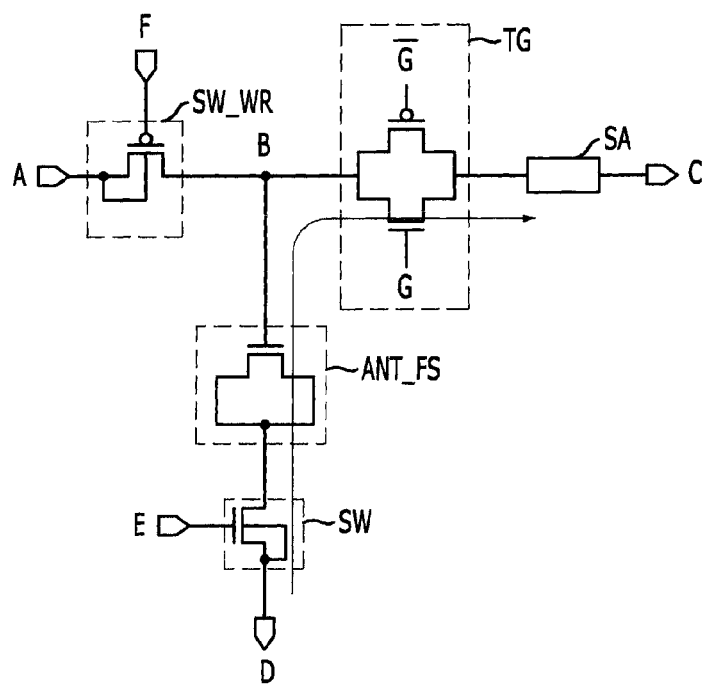

Each operation is explained referring to Table 2, and FIGS. 9 to 10B. Herein, FIG. 9 is an equivalent circuit diagram illustrating a current path during the write operation, and FIGS. 10A and 10B are equivalent circuit diagrams illustrating a current path during the read operation.

Write Operation

Referring to FIG. 9, a ground voltage terminal D is grounded, a write voltage of a high voltage VPP is applied to the input terminal A, a voltage of a logic high level corresponding to a supply voltage VDD is applied to a current control signal input terminal E, and a voltage of a logic low level corresponding to a ground voltage VSS is applied to the read/write control signal input terminal F and the read control signal input terminal G. Under these conditions, the first switching unit SW and the second switching unit SW_WR are turned on, and thus the input terminal A is electrically connected to the node B but the node B is electrically isolated from the output terminal C. Accordingly, the write voltage of the high voltage VPP applied to the input terminal A is transferred to the antifuse ANT_FS through the node B to thereby break the gate insulation layer of the antifuse ANT_FS, which is formed between the gate of the antifuse ANT_FS and a substrate. As a result, the gate of the antifuse ANT_FS is isolated from the substrate.

Read Operation

First, referring to FIG. 10B, after finishing the write operation, a read voltage of the supply voltage VDD is applied to the input terminal A, a voltage of a logic high level corresponding to the supply voltage VDD is applied to the current control signal input terminal E and the read control signal input terminal G, and a voltage of a logic low level corresponding to the ground voltage VSS is applied to the read/write control signal input terminal F. Under these conditions, the first switching unit SW and the transmission gate TG are turned on, and thus the output terminal C is electrically connected to the node B. At this time, since the gate insulation layer of the antifuse ANT_FS is in a broken state, a current path of the transmission gate TG->the node B->the antifuse ANT_FS->the first switching unit SW->the ground voltage terminal D is formed. Further, though the second switching unit SW_WR is turned on, the read voltage of the supply voltage VDD goes to the ground voltage terminal D through the second switching unit SW_WR since the node B is coupled to the ground voltage terminal D. As a result, the output terminal C is electrically coupled to the ground voltage terminal D through the transmission gate TG, the antifuse ANT_FS and the first switching unit SW so that a data corresponding to the ground voltage VSS is outputted to the output terminal C through the sensing amplifier SA.

Next, referring to FIG. 10A, when the write operation is not performed and thus the gate insulation layer of the antifuse ANT_FS is not broken, the output terminal C is electrically isolated from the ground voltage terminal D through the transmission gate TG, the antifuse ANT_FS and the first switching unit SW. At this time, since the second switching unit SW_WR maintains a turned-on state, the input terminal A is electrically connected to the node B. Accordingly, the read voltage applied to the input terminal A is not discharged

TABLE 2

| mode/terminal(node) | A | B | C | D | E | F | G |
|---|---|---|---|---|---|---|---|
| write operation | VPP | VPP | — | VSS | H | L | L |
| read operation | VDD | VDD or VSS | VDD or VSS | VSS | H | L | H | to the ground voltage terminal D through the antifuse ANT_FS but outputted to the output terminal C through the node B. That is, a data corresponding to the supply voltage VDD is outputted to the output terminal C through the sensing amplifier SA.

Third Embodiment

Figure 11:
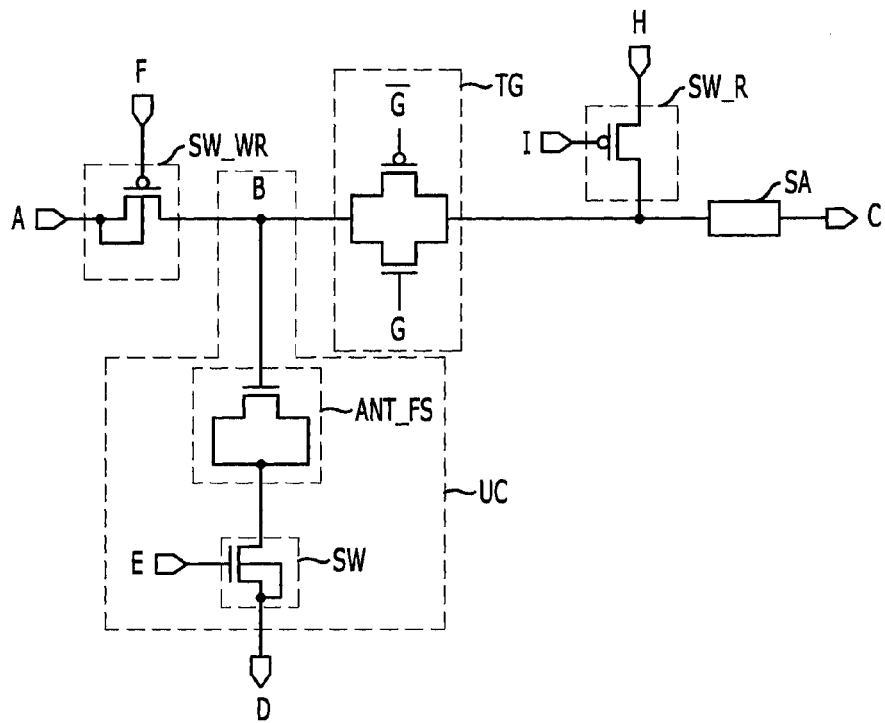
FIG. 11 is an equivalent circuit diagram of a unit cell of a nonvolatile memory device in accordance with a third embodiment of the present invention.

FIG. 11 is an equivalent circuit diagram of a unit cell of a nonvolatile memory device in accordance with a third embodiment of the present invention.

Referring to FIG. 11, the unit cell of the nonvolatile memory device in accordance with the third embodiment further includes a third switching unit SW_R in addition to all constituent elements of the unit cell in accordance with the second embodiment. The third switching unit SW_R coupled between a supply voltage terminal H, and a common node of a transmission gate TG and a sensing amplifier SA.

In the second embodiment shown in FIG. 8, both of the write voltage and the read voltage are applied to the input terminal A. However, in the third embodiment, the write voltage is applied to the input terminal A and the read voltage is applied through the third switching unit SW_R. The third switching unit SW_R receives the read voltage of the supply voltage VDD to transfer it the common node of the transmission gate TG and the sensing amplifier SA during the read operation in response to a read voltage control signal inputted through a read voltage control signal input terminal I. Since the other elements except for the third switching unit SW_R are identical with the constituent elements of the second embodiment shown in FIG. 8, their detailed description will be omitted for conciseness.

Hereinafter, the read operation and the write operation of the unit cell of the nonvolatile memory device in accordance with the third embodiment are explained in detail. It is assumed that the first switching unit SW and the third first switching unit SW_R are a transistor having an N-channel, the second switching unit SW_WR is a transistor having a P-channel, and the antifuse ANT_FS is a transistor having an N-channel.

gate insulation layer of the antifuse ANT_FS, which is formed between the gate of the antifuse ANT_FS and a substrate. As a result, the gate of the antifuse ANT_FS is electrically isolated from the substrate.

Read Operation

Figure 13A:
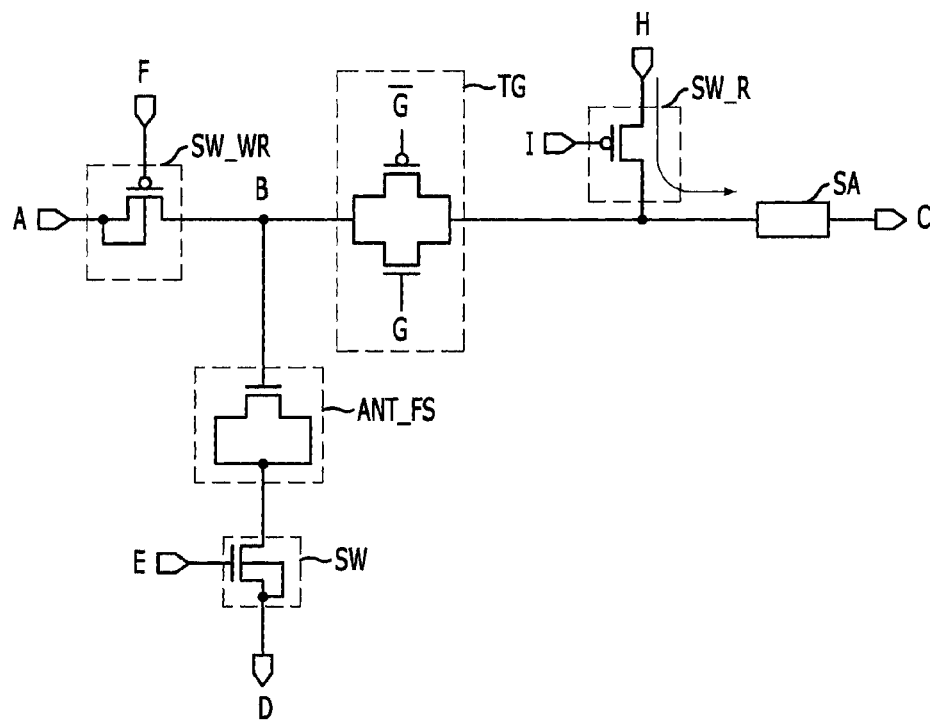
Figure 13B:
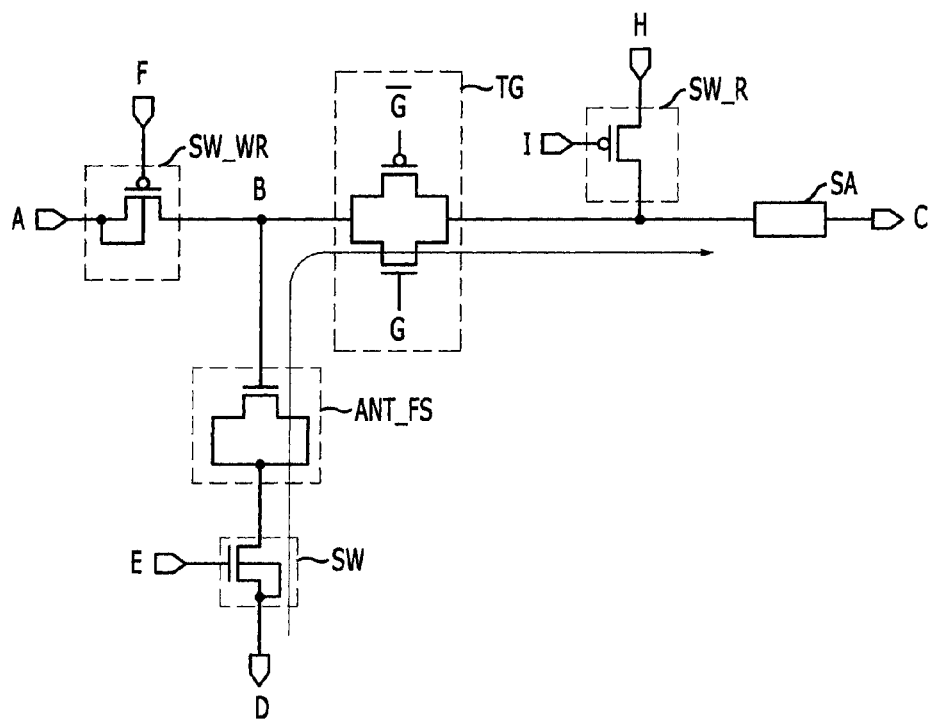

First, referring to FIG. 13B, after finishing the write operation, a read voltage of the supply voltage VDD is applied to the supply voltage terminal H, a voltage of a logic high level corresponding to the supply voltage VDD is applied to the current control signal input terminal E, the read/write control signal input terminal F, and the read control signal input terminal G while a voltage of a logic low level is applied to the read voltage control signal input terminal I. Under these conditions, the first switching unit SW and the transmission gate TG are turned on, and thus the output terminal C is electrically connected to the node B. At this time, since the gate insulation layer of the antifuse ANT_FS is in a broken state, a current path of the transmission gate TG->the node B->the antifuse ANT_FS->the first switching unit SW->the ground voltage terminal D is formed. As a result, the output terminal C is electrically coupled to the ground voltage terminal D through the transmission gate TG, the antifuse ANT_FS and the first switching unit SW so that a data corresponding to the ground voltage VSS is outputted to the output terminal C through the sensing amplifier SA.

Next, referring to FIG. 13A, when the write operation is not performed, the gate insulation layer of the antifuse ANT_FS is not broken. Thus, the output terminal C is electrically isolated from the ground voltage terminal D through the transmission gate TG, the antifuse ANT_FS and the first switching unit SW. As a result, the read voltage applied to the supply voltage terminal H is not discharged to the ground voltage terminal D through the antifuse ANT_FS but outputted to the output terminal C. That is, a data corresponding to the supply voltage VDD is outputted to the output terminal C through the sensing amplifier SA.

Hereinafter, a memory cell array of a nonvolatile memory device having a plurality of unit cells in accordance with the

TABLE 3

| mode/terminal(node) | A | B | C | D | E | F | G | H | I |
|---|---|---|---|---|---|---|---|---|---|
| write operation | VPP | VPP | — | VSS | H | L | L | VDD | H |
| read operation | — | VDD or VSS | VDD or VSS | VSS | H | H | H | VDD | L |

Figure 12:
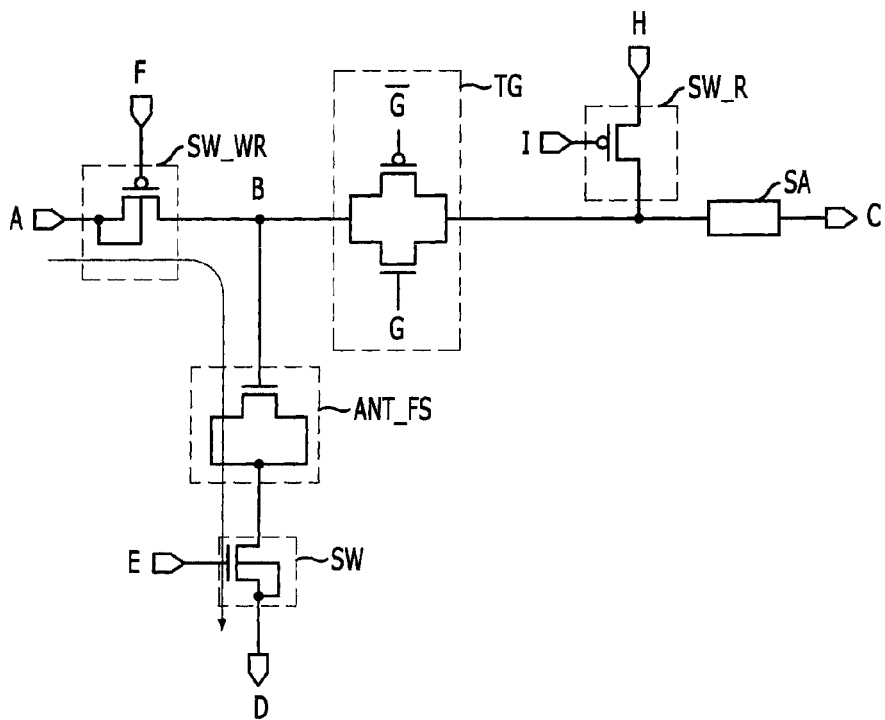
FIGS. 12 to 13B are equivalent circuit diagrams illustrating an operation of the unit cell of the nonvolatile memory device in accordance with the third embodiment of the present invention.

Each operation is explained referring to Table 3, and FIGS. 12 to 13B. Herein, FIG. 12 is an equivalent circuit diagram illustrating a current path during the write operation, and FIGS. 13A and 13B are equivalent circuit diagrams illustrating a current path during the read operation.

Write Operation

Referring to FIG. 12, a ground voltage terminal D is grounded, a write voltage of a high voltage VPP is applied to the input terminal A. A voltage of a logic high level corresponding to a supply voltage VDD is applied to a current control signal input terminal E and the read voltage control signal input terminal I, and a voltage of a logic low level corresponding to a ground voltage VSS is applied to a read/write control signal input terminal F and a read control signal input terminal G. Under these conditions, the first switching unit SW and the second switching unit SW_WR are turned on, and thus the input terminal A is electrically connected to the node B but the node B is electrically isolated from the output terminal C. Accordingly, the write voltage of the high voltage VPP applied to the input terminal A is transferred to the antifuse ANT_FS through the node B to thereby break the above described embodiments is described in detail. It is assumed that the memory cell array includes the unit cells in accordance with the first embodiment. For reference, a reference numeral 'VDD' denotes a supply voltage, and a reference numeral 'VSS' denotes a ground voltage.

Figure 14:
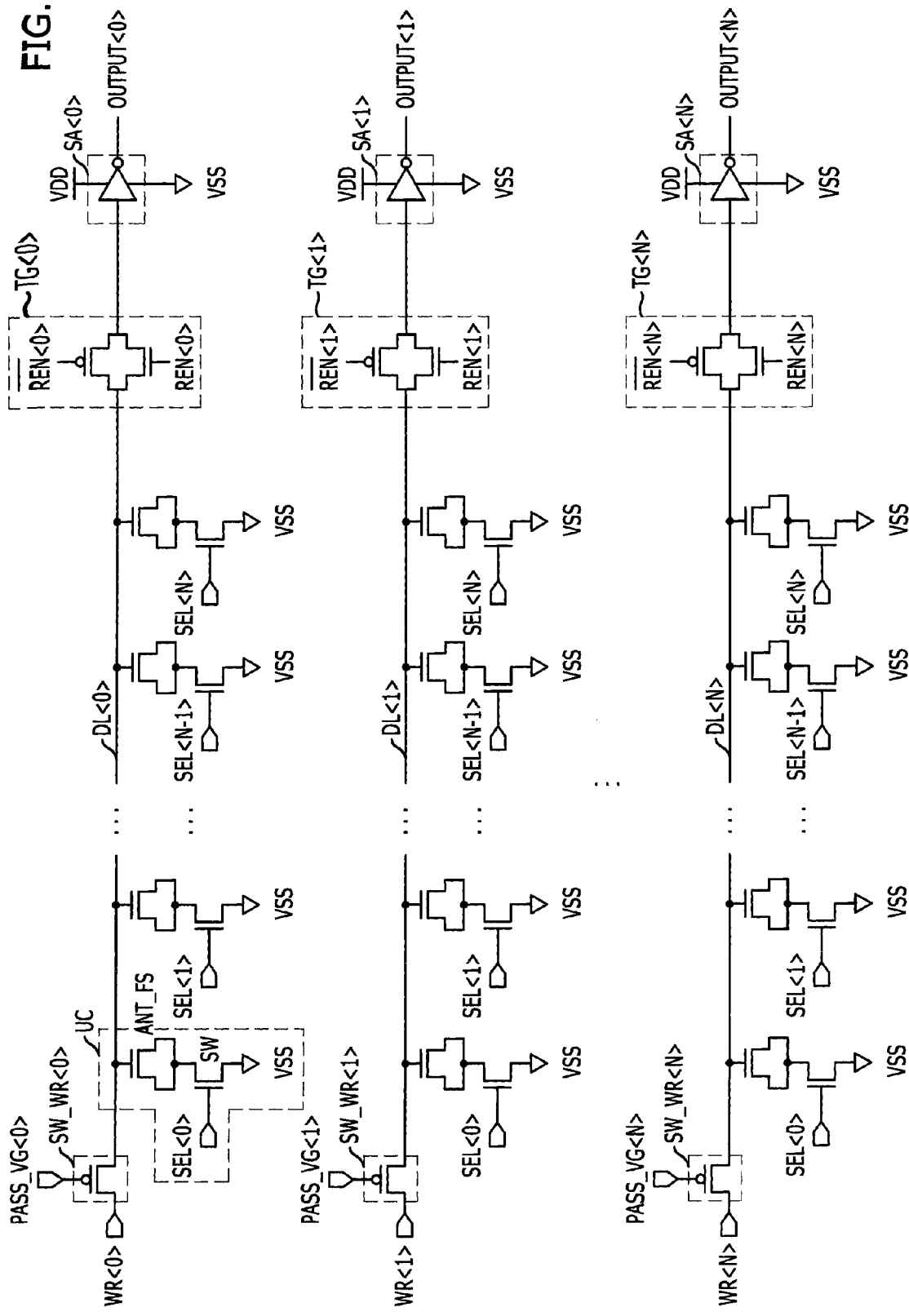
FIG. 14 is an equivalent circuit diagram of a nonvolatile memory device in accordance with a fourth embodiment of the present invention.

FIG. 14 is an equivalent circuit diagram of a nonvolatile memory device in accordance with a fourth embodiment of the present invention.

Referring to FIG. 14, the nonvolatile memory device in accordance with the fourth embodiment includes a plurality of unit cells UCs of the first embodiment as described in FIG. 3. The unit cell UC includes a first switching unit SW and an antifuse ANT_FS coupled to the switching unit SW in series such as the first embodiment.

In the preferred embodiment of the present invention instance, the first switching unit SW in the unit cell UC includes a transistor having an N-channel, and the antifuse ANT_FS also includes a transistor having an N-channel.

The unit cells UCs are coupled to a plurality of data lines DL<0> to DL<N>, N being a natural number. The predetermined numbers of the unit cells UCs are coupled between a ground voltage terminal and a corresponding data line in parallel. That is, a first terminal of the antifuse ANT_FS is coupled to the corresponding data line and the first switching unit SW is coupled to the ground voltage terminal.

A plurality of sensing amplifiers SA<0> to SA<N> are arranged at each terminal of the data lines DL<0> to DL<N> for sensing a data outputted from the data lines DL<0> to DL<N>. That is, each of the sensing amplifiers SA<0> to SA<N> corresponds to each of the data lines DL<0> to DL<N>.

The sensing amplifiers SA<0> to SA<N> may be formed of an inverter as shown FIG. 14. Since the inverter has a simple structure compared with a differential amplifier shown in FIG. 15, it is possible to make efficient use of size and power consumption.

A plurality of second switching units SW_WR<0> to SW_WR<N> are coupled to each of the data lines DL<0> to DL<N> for applying a read voltage and a write voltage to the data lines DL<0> to DL<N> during a read operation and a write operation. Furthermore, the second switching units SW_WR<0> to SW_WR<N> transfers the write voltage to the data lines DL<0> to DL<N> during the write operation, and disconnects the write voltage from being transferring to the data lines DL<0> to DL<N> during the read operation. The function of the second switching units SW_WR<0> to SW_WR<N> may vary according to a position where the read voltage is applied during the read operation. For example, when both of the read voltage and the write voltage are applied to an input terminal in accordance with the second embodiment of FIG. 8, the second switching units SW_WR<0> to SW_WR<N> transfer the read voltage and the write voltage to the data lines DL<0> to DL<N> during the read operation and the write operation. When the read voltage is applied to an input terminal but the write voltage is applied to the side of an output terminal in accordance with the third embodiment of FIG. 11, the second switching units SW_WR<0> to SW_WR<N> transfer the write voltage to the data lines DL<0> to DL<N> only during the write operation, and electrically disconnect the data lines DL<0> to DL<N> from input terminals WR<0> to WR<N> during the read operation, i.e., the second switching units SW_WR<0> to SW_WR<N> do not operate during the read operation.

The input terminals WR<0> to WR<N> applying the read voltage and the write voltage to the data lines DL<0> to DL<N> receives the read voltage and the write voltage from decoders (not shown).

A plurality of transmission gates TG<0> to TG<N> are arranged between the data lines DL<0> to DL<N> and the sensing amplifiers SA<0> to SA<N> to thereby disconnect the data lines DL<0> to DL<N> from the sensing amplifiers SA<0> to SA<N> during the write operation, and connect the data lines DL<0> to DL<N> with the sensing amplifiers SA<0> to SA<N> during the read operation.

The first switching unit SW of each unit cell UC constituting the cell array is selected in response to a plurality of current control signals SEL<0> to SEL<N>. That is, the first switching unit SW is turned on by a corresponding one of the current control signals SEL<0> to SEL<N> to connect the antifuse ANT_FS with the ground voltage VSS. The first switching unit SW maintains a turned-on state during the write operation and the read operation.

Each of the second switching units SW_WR<0> to SW_WR<N> is selected in response to a plurality of read/write control signals PASS_VG<0> to PASS_VG<N>. That is, the second switching units SW_WR<0> to SW_WR<N> are turned on by the read/write control signals PASS_VG<0> to PASS_VG<N> to connect the data lines DL<0> to DL<N> with the input terminals WR<0> to WR<N> where the read voltage and the write voltage are applied.

Each of the transmission gates TG<0> to TG<N> is selected in response to a plurality of read control signals REN<0> to REN<N>. That is, the transmission gates TG<0> to TG<N> are turned on by the read control signals REN<0> to REN<N> to connect the data lines DL<0> to DL<N> with the sensing amplifiers SA<0> to SA<N>.

Hereinafter, the read operation and the write operation of the nonvolatile memory device in accordance with the fourth embodiment are explained in detail. For example, the read operation and the write operation to a first unit cell among the unit cells UCs, coupled to a first data line DL<0>, are explained.

TABLE 4

| | mode/line (signal) | | | | | | | |
|---|---|---|---|---|---|---|---|---|
| | WR<0> | WR<1>~ WR<N> | SEL<0> | SEL<1>~ SEL<N> | PASS_VG<0> | PASS_VG<1>~ PASS_VG<N> | REN<0> | REN<1>~ REN<N> |
| write operation | VPP | VSS | H | L | L | H | L | L |
| read operation | VDD | VSS | H | L | L | H | H | L |

Each operation is explained referring to Table 4.

Write Operation

The write voltage of a high voltage VPP is applied to a first input terminal WR<0>, and the ground voltage VSS is applied to the other input terminals WR<1> to WR<N>. A voltage of a logic high level is applied to a first current control signal SEL<0>, and a voltage of a logic low level is applied to the other current control signals SEL<1> to SEL<N>. A voltage of a logic low level is applied to a first read/write control signal PASS_VG<0> and a voltage of a logic high level is applied to the other read/write control signals PASS_VG<1> to PASS_VG<N>. A voltage of a logic low level is applied to the read control signals REN<0> to REN<N>. Under these conditions, the first switching unit SW and the second switching unit SW_WR<0> are turned on, and thus the first input terminal WR<0> is only electrically connected to the first data line DL<0> but a first output terminal OUTPUT<0> is electrically isolated from the first data line DL<0>. Accordingly, the write voltage of the high voltage VPP applied to the first input terminal WR<0> is transferred to the antifuse ANT_FS of the unit cell UC through the second switching unit SW_WR<0> to thereby break the gate insulation layer of the antifuse ANT_FS, which is formed between the gate of the antifuse ANT_FS and a substrate. As a result, the gate of the antifuse ANT_FS is isolated from the substrate.

Read Operation

After finishing the write operation, the read voltage of the supply voltage VDD is applied to the first input terminal WR<0>, and the ground voltage VSS is applied to the other input terminals WR<1> to WR<N>. A voltage of a logic high level is applied to the first current control signal SEL<0>, and a voltage of a logic low level is applied to the other current control signals SEL<1> to SEL<N>. A voltage of a logic low level is applied to the first read/write control signal PASS_VG<0>, and a voltage of a logic high level is applied to the other read/write control signals PASS_VG<1> to PASS_VG<N>. A voltage of a logic high level is applied to a first read control signal REN<0>, and a voltage of a logic low level is applied to the other read control signals REN<1> to REN<N>.

Under these conditions, the first switching unit SW and a first transmission gate TG<0> are turned on, and thus the first output terminal OUTPUT<0> is electrically connected to the first data line DL<0>. At this time, since the gate insulation layer of the antifuse ANT_FS is in a broken state, a current path of the first transmission gate TG<0>->the first data line DL<0>->the antifuse ANT_FS->the first switching unit SW->the ground voltage terminal is formed. Further, though the second switching unit SW_WR<0> is turned on, the read voltage of the supply voltage VDD goes to the ground voltage terminal through the second switching unit SW_WR<0> since the first data line DL<0> is coupled to the ground voltage terminal. As a result, the first output terminal OUTPUT<0> is electrically coupled to the ground voltage terminal through the first transmission gate TG<0>, the antifuse ANT_FS and the first switching unit SW so that a data corresponding to the ground voltage VSS is outputted to the first output terminal OUTPUT<0> through a first sensing amplifier SA<0>.

Next, when the write operation is not performed and thus the gate insulation layer of the antifuse ANT_FS is not broken, the first output terminal OUTPUT<0> is electrically isolated from the ground voltage terminal through the first transmission gate TG<0>, the antifuse ANT_FS and the first switching unit SW. As a result, the read voltage applied to the first input terminal WR<0> is not discharged to the ground voltage terminal through the antifuse ANT_FS but outputted to the first output terminal OUTPUT<0> through the first data line DL<0>. That is, a data corresponding to the supply voltage VDD is outputted to the first output terminal OUTPUT<0> through the first sensing amplifier SA<0>.

Fifth Embodiment

FIG. 15 is an equivalent circuit diagram of a nonvolatile memory device in accordance with a fifth embodiment of the present invention.

Referring to FIG. 15, a memory cell array of the nonvolatile memory device in accordance with the fifth embodiment has substantially the same structure as that of the fourth embodiment except that the sensing amplifiers SA<0> to SA<N> are not formed of an inverter but a differential amplifier. The differential amplifier includes transistors PM1 and PM2, each having a P-channel, and third to fifth transistors NM1, NM2, and NM3, each having an N-channel. The differential amplifier operates in response to a bias signal BIAS to compare a reference voltage VREF with a data of a unit cell outputted from a corresponding one of the data lines DL<0> to DL<N> and amplify and output the compared result. Since the other elements except for the sensing amplifiers SA<0> to SA<N> are identical with the constituent elements of the fourth embodiment shown in FIG. 14, their detailed description will be omitted for conciseness.

Figure 16:
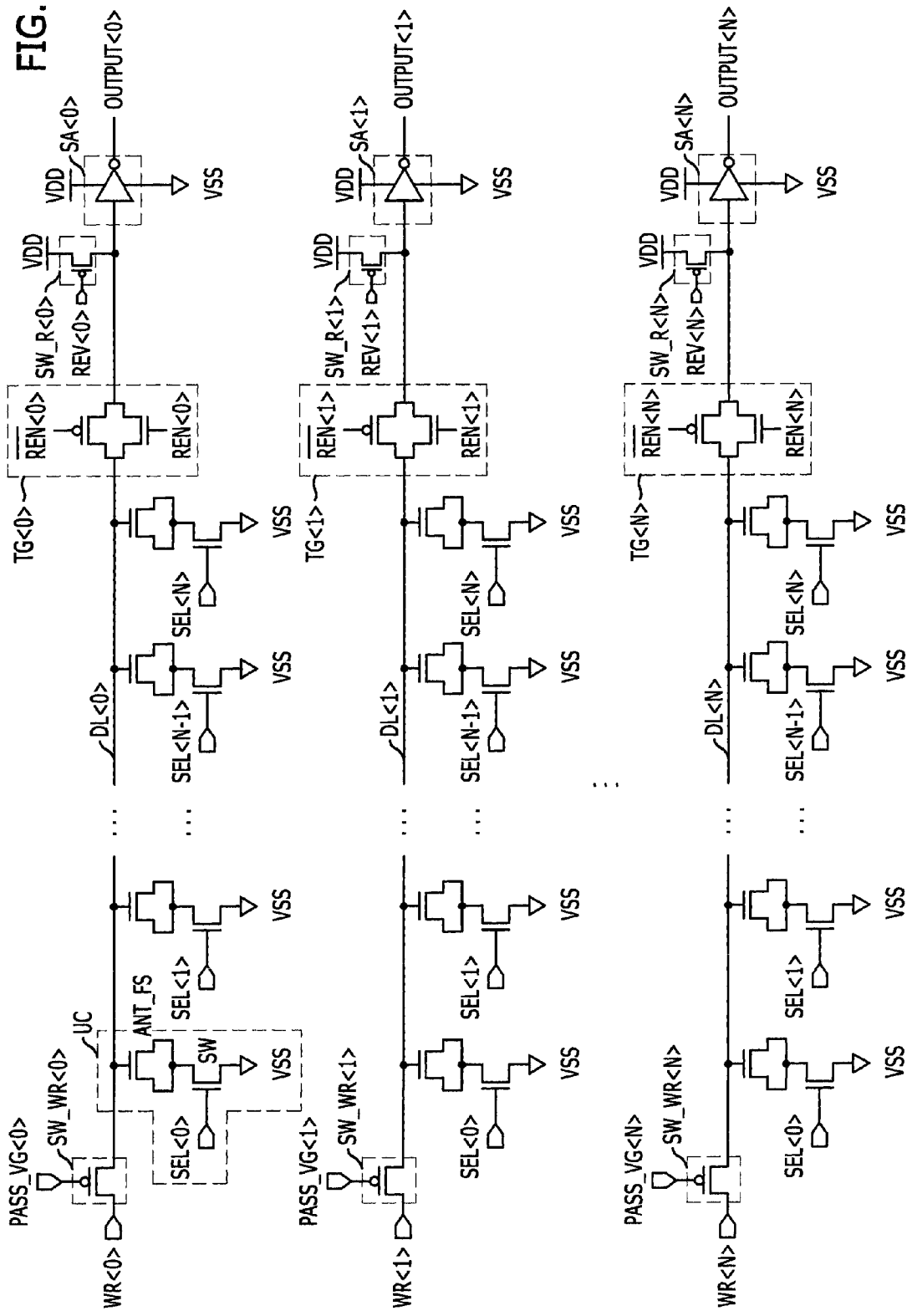
FIG. 16 is an equivalent circuit diagram of a nonvolatile memory device in accordance with a sixth embodiment of the present invention.

FIG. 16 is an equivalent circuit diagram of a nonvolatile memory device in accordance with a sixth embodiment of the present invention.

Referring to FIG. 16, the nonvolatile memory device in accordance with the sixth embodiment further includes a plurality of third switching units SW_R<0> to SW_R<N> in addition to all constituent elements in accordance with the fourth embodiment. The third switching units SWR<0> to SW_R<N> are coupled between a supply voltage terminal, and a common node of transmission gates TG<0> to TG<N> and sensing amplifiers SA<0> to SA<N> to transfer a read voltage of a supply voltage VDD to the common node of the transmission gates TG<0> to TG<N> and the sensing amplifiers SA<0> to SA<N>.

Hereinafter, a read operation and a write operation of the nonvolatile memory device in accordance with the sixth embodiment are explained in detail. For example, the read operation and the write operation to a first unit cell among the unit cells UCs, coupled to a first data line DL<0>, are explained.

TABLE 5

| | mode/line (signal) | | | | | | | | |
|---|---|---|---|---|---|---|---|---|---|
| | WR<0> | WR<1>~ WR<n> | SEL<0> | SEL<1>~ SEL<N> | PASS_VG<0> | PASS_VG<1>~ PASS_VG<N> | REN<0> | REN<1>~ REN<N> | REV<0> | REV<1>~ REV<N> |
| write operation | VPP | VSS | H | L | L | H | L | L | H | H |
| read operation | — | VSS | H | L | H | H | H | L | L | H |

Each operation is explained referring to Table 5.

Write Operation

The write voltage of a high voltage VPP is applied to a first input terminal WR<0>, and the ground voltage VSS is applied to the other input terminals WR<1> to WR<N>. A voltage of a logic high level is applied to a first current control signal SEL<0>, and a voltage of a logic low level is applied to the other current control signals SEL<1> to SEL<N>. A voltage of a logic low level is applied to a first read/write control signal PASS_VG<0> and a voltage of a logic high level is applied to the other read/write control signals PASS_VG<1> to PASS_VG<N>. A voltage of a logic low level is applied to the read control signals REN<0> to REN<N>, and a voltage of a logic high level is applied to a plurality of read voltage control signals REV<0> to REV<N>. Under these conditions, the first switching unit SW and the second switching unit SWWR<0> are turned on, and thus the first input terminal WR<0> is only electrically connected to the first data line DL<0> but a first output terminal OUTPUT<0> is electrically isolated from the first data line DL<0>. Accordingly, the write voltage of the high voltage VPP applied to the first input terminal WR<0> is transferred to the antifuse ANT_FS of the unit cell UC through the second switching unit SW_WR<0> to thereby break the gate insulation layer of the antifuse ANT_FS, which is formed between the gate of the antifuse ANT_FS and a substrate. As a result, the gate of the antifuse ANT_FS is isolated from the substrate.

Read Operation

After finishing the write operation, the read voltage of the supply voltage VDD is applied to the supply voltage terminal, and the ground voltage VSS is applied to the input terminals WR<0> to WR<N> during the read operation. A voltage of a logic high level is applied to the first current control signal SEL<0>, and a voltage of a logic low level is applied to the other current control signals SEL<1> to SEL<N>. A voltage of a logic high level is applied to the read/write control signals PASS_VG<0> to PASS_VG<N>. A voltage of a logic high level is applied to a first read control signal REN<0>, and a voltage of a logic low level is applied to the other read control signals REN<1> to REN<N>. A voltage of a logic low level is applied to the first read voltage control signals REV<0>, and a voltage of a logic high level is applied to the other read voltage control signals REV<1> to REV<N>.

Under these conditions, the first switching unit SW and a first transmission gate TG<0> are turned on, and thus the first output terminal OUTPUT<0> is electrically coupled to the first data line DL<0>. At this time, since the gate insulation layer of the antifuse ANT_FS is in a broken state, a current path of the first transmission gate TG<0>->the first data line DL<0>->the antifuse ANT_FS->the first switching unit SW->the ground voltage terminal is formed. As a result, the first output terminal OUTPUT<0> is electrically coupled to the ground voltage terminal through the first transmission gate TG<0>, the antifuse ANT_FS and the first switching unit SW so that a data corresponding to the ground voltage VSS is outputted to the first output terminal OUTPUT<0> through a first sensing amplifier SA<0>.

Next, when the write operation is not performed, the gate insulation layer of the antifuse ANT_FS is not broken. Thus, the first output terminal OUTPUT<0> is electrically isolated from the ground voltage terminal through the first transmission gate TG<0>, the antifuse ANTFS and the first switching unit SW. As a result, the read voltage applied to the supply voltage terminal is not discharged to the ground voltage terminal through the antifuse ANT_FS but outputted to the first output terminal OUTPUT<0> through the third switching unit SW_R<0> and the first data line DL<0>. That is, a data corresponding to the supply voltage VDD is outputted to the first output terminal OUTPUT<0> through the first sensing amplifier SA<0>.

Seventh Embodiment

FIG. 17 is an equivalent circuit diagram of a nonvolatile memory device in accordance with a seventh embodiment of the present invention.

Referring to FIG. 17, a memory cell array of the nonvolatile memory device in accordance with the seventh embodiment has substantially the same structure as that of the sixth embodiment except that the sensing amplifiers SA<0> to SA<N> are not formed of an inverter but a differential amplifier. The differential amplifier includes transistors PM1 and PM2, each having a P-channel, and third to fifth transistors NM1, NM2, and NM3, each having an N-channel. The differential amplifier operates in response to a bias signal BIAS to compare a reference voltage VREF with a dAa of a unit cell outputted from a corresponding one of the data lines DL<0> to DL<N> and amplify and output the compared result. Since the other elements except for the sensing amplifiers SA<0> to SA<N> are identical with the constituent elements of the sixth embodiment shown in FIG. 16, their detailed description will be omitted for conciseness.

As described above, the embodiments of the present invention can minimize loss of a read voltage to thereby improve a driving reliability by enhancing a data sensing margin in a read operation. Furthermore, the embodiments of the present invention can reduce size and power consumption by simplifying a cell structure of a nonvolatile memory device.

While the present invention has been described with respect to the specific embodiments, it will be apparent to those skilled in the art that various changes and modifications may be made without departing from the spirit and scope of the invention as defined in the following claims.

What is claimed is:

1. A unit cell of a nonvolatile memory device, comprising:
an antifuse having a first terminal coupled between an input terminal and an output terminal, a write voltage being applied through the input terminal to the first terminal during a write operation;
a first switching unit coupled between a second terminal of the antifuse and a ground voltage terminal: and
a second switching unit coupled between the input terminal and the first terminal of the antifuse,
wherein the second switching unit receives a read voltage during a read operation and the write voltage during the write operation respectively, and transfers the received voltage to the first terminal of the antifuse.

2. The unit cell of claim 1, further comprising a transmission gate coupled between the first terminal of the antifuse and the output terminal.

3. The unit cell of claim 2, wherein the transmission gate disconnects the first terminal of the antifuse from the output terminal during the write operation, and connects the first terminal of the antifuse with the output terminal during the read operation.

4. The unit cell of claim 2, further comprising a third switching unit coupled between a supply voltage terminal and a common node of the transmission gate and the output terminal.

5. The unit cell of claim 4, wherein the third switching unit transfers a read voltage of a supply voltage to the common node of the transmission gate and the output terminal during the read operation.

6. The unit cell of claim 4, further comprising a sensing amplifier coupled between the transmission gate and the output terminal.

7. The unit cell of claim 6, wherein the sensing amplifier senses and amplifies a data outputted from the transmission gate during the read operation.

8. The unit cell of claim 6, wherein the sensing amplifier includes an inverter or a differential amplifier.

9. The unit cell of claim 4, wherein the first switching unit includes a transistor having an N-channel, and the second and third switching units include a transistor having a P-channel.

10. The unit cell of claim 1, wherein the antifuse includes a transistor or a capacitor.

11. A nonvolatile memory device, comprising:
a plurality of data lines;
a plurality of unit cells of claim 1 coupled to the data lines in parallel; and
a plurality of sensing amplifiers configured to sense and amplify data outputted from the data lines, wherein
the first terminal of the antifuse of each unit cell is coupled to a corresponding one of the data lines.

12. The nonvolatile memory device of claim 11, further comprising a plurality of second switching units, each of which is coupled to the corresponding data line to receive the read voltage during the read operation and the write voltage during the write operation respectively, and transfer the received voltage to the corresponding data line.

13. The nonvolatile memory device of claim 12, further comprising a plurality of transmission gates, each transmission gate coupled between the corresponding data line and each sensing amplifier.

14. The nonvolatile memory device of claim 13, wherein each of the transmission gates disconnects the corresponding data line from each sensing amplifier during the write operation, and connects the corresponding data line with each sensing amplifier during the read operation.

15. The nonvolatile memory device of claim 13, further comprising a plurality of third switching units, each third switching unit coupled between a supply voltage terminal and a common node of each transmission gate and each sensing amplifier.

16. The nonvolatile memory device of claim 15, wherein each third switching unit transfers the read voltage of a supply voltage to the common node of each transmission gate and each sensing amplifier during the read operation.

17. The nonvolatile memory device of claim 15, wherein the first switching units include a transistor having an N-channel, and the second and third switching units include a transistor having a P-channel.

18. The nonvolatile memory device of claim 12, wherein the write voltage has a voltage level higher than the read voltage.

19. The nonvolatile memory device of claim 11, further comprising a plurality of second switching units, each of which is coupled to the corresponding data line to transfer the write voltage to the corresponding data line during the write operation, and be disconnected from the corresponding data line during the read operation.

20. The nonvolatile memory device of claim 11, wherein each sensing amplifier includes an inverter or a differential amplifier.

21. The nonvolatile memory device of claim 11, wherein the antifuse includes a transistor or a capacitor.

22. The nonvolatile memory device of claim 11, wherein the first terminal of the antifuse of each of the unit cells is coupled between an input terminal and an output terminal of the corresponding one of the data lines, and
the write voltage is applied through the input terminal to the first terminal of the antifuse during the write operation.

23. A nonvolatile memory device, comprising:
a plurality of unit cells of claim 1 coupled to a data line in parallel, wherein the first terminal of the antifuse of each unit cell is coupled between an input terminal and an output terminal of the data line.

24. A unit cell of a nonvolatile memory device, comprising:
an antifuse having a first terminal coupled between an input terminal and an output terminal;
a first switching unit coupled between a second terminal of the antifuse and a ground voltage terminal; and
a second switching unit coupled between the input terminal and the first terminal of the antifuse,
wherein the second switching unit receives a read voltage during a read operation and a write voltage during a write operation respectively; and
the second switching unit transfers the write voltage applied through the input terminal to the first terminal of the antifuse during the write operation, and disconnects the input terminal from the first terminal of the antifuse during the read operation.

25. The unit cell of claim 24, wherein the write voltage has a voltage level higher than the read voltage.

\* \* \* \* \*